United States Patent [19]
Ano

[11] Patent Number: 6,060,775
[45] Date of Patent: May 9, 2000

[54] SEMICONDUCTOR DEVICE

[75] Inventor: Kazuaki Ano, Hiji-machi, Japan

[73] Assignee: Texas Instruments Incorporated, Dallas, Tex.

[21] Appl. No.: 08/902,994

[22] Filed: Jul. 30, 1997

[30] Foreign Application Priority Data

Jul. 30, 1996 [JP] Japan ..................................... 8-216775

[51] Int. Cl.⁷ ............................ H01L 23/12; H01L 23/14
[52] U.S. Cl. ......................... 257/693; 257/690; 257/700; 257/691; 257/738
[58] Field of Search .................................. 257/690, 700, 257/693, 691, 738

[56] References Cited

U.S. PATENT DOCUMENTS

| | | | |
|---|---|---|---|
| 5,239,198 | 8/1993 | Lin et al. ................................. | 257/693 |
| 5,583,376 | 12/1996 | Sickler et al. .......................... | 257/702 |
| 5,598,321 | 1/1997 | Mostafazadeh et al. ............... | 361/704 |
| 5,640,047 | 6/1997 | Nakashima ............................. | 257/738 |
| 5,708,567 | 1/1998 | Shim et al. ............................. | 361/723 |
| 5,753,974 | 5/1998 | Masukawa ............................. | 257/737 |
| 5,886,409 | 3/1999 | Ishino et al. ............................ | 257/737 |

OTHER PUBLICATIONS

Patent Abstracts of Japan, Voltage. 96, No. 6, Jun. 28, 1996, JP 8–46351 A (M&M Prod K.K.), Feb. 16, 1996.

*Primary Examiner*—Leo P. Picard
*Assistant Examiner*—Hung Van Duong
*Attorney, Agent, or Firm*—William B. Kempler; Frederick J. Telecky, Jr.

[57] ABSTRACT

The goal of the present invention is in the manufacture of BGA type semiconductor IC packages, to obviate the processing step in which the through-holes in the insulating substrate are filled with solder paste, and to reduce the thermal stress at the bonding portion of the solder balls.

This goal is achieved through the following. Through-holes (2a) are formed on insulating substrate (2) at positions corresponding to the positions where the solder balls are formed. On the surface of the insulating substrate where chip (3) is carried, conductor pattern (6) is formed, with the end [of each portion] of the conductor pattern positioned above through-hole (2a). The region of the aforementioned conductor pattern on each through-hole has portion (6d) protruding into the through-hole. Solder ball (7) is moved and carried on each through-hole to make contact with said bump portion (6d). In this state, the solder balls are melted and bump portions (6d) are directly bonded on solder balls (7). It is possible to form bump portions (6d) by performing buckling processing of the pattern. The bumps formed by buckling processing can reduce the thermal stress applied on these portions.

8 Claims, 3 Drawing Sheets

SEMICONDUCTOR DEVICE

FIELD OF THE INVENTION

The present invention pertains to a BGA type semiconductor IC package and its manufacturing method. In particular, the present invention pertains to its bump structure and the bump formation method.

BACKGROUND OF THE INVENTION

In order to meet the demand for smaller semiconductor IC packages with more pins, the BGA type semiconductor IC package has come into the spotlight as a replacement of the conventional QFP (Quad Flat Package) and TCP (Tape Carrier Package). The BGA (Ball Grid Array) type semiconductor IC is a surface mount type package in which the solder bumps as the connecting terminals are arranged two-dimensionally on the bottom surface of the insulating substrate on which the IC chip is assembled. As the connecting terminals are arranged in a two-dimensional pattern, even when the number of pins is increased, the dimensions of the package still do not become larger, and the terminal pitch can be selected as 1 mm or larger, so that the conventional overall reflow assembly technology can be adopted. This is an advantage of BGA.

One of the BGA type semiconductor IC packages has solder bumps connected to a conductor pattern formed as a prescribed pattern on the surface on the opposite side (the side of the IC chip) of the insulating substrate with through-holes formed two-dimensionally on the insulating substrate. The following method is usually adopted: in the package of this constitution, the through-holes are filled with solder paste by means of a squeezer; nearly spherical solder balls are arranged above them, and they are melted by means of overall reflow. The solder paste filling the through-holes acts as a bridge between the conductor pattern and the solder balls. If the solder paste were not there, it would be difficult for the solder to fill the through-holes completely during the reflow operation, and gaps would form between the conductor pattern and the solder balls, so that bonding to the conductor pattern would not be realized. This is because the solder balls are acted upon by a force that tends to maintain its spherical form, that is, surface tension.

On the other hand, with respect to the necessity of the solder paste, presence/absence of the step of operation of filling the solder paste into the through-holes has a major influence on the productivity and cost of the package.

Basically, the distance between the conductor pattern and the solder balls depends on the thickness of the insulating substrate, the diameter of the through-holes and the diameter of the solder balls. Consequently, when the solder balls are to fill the through-holes completely without using the solder paste, the diameter of the through-holes must be further increased or the diameter of the solder balls decreased.

However, when the diameter of the through-holes is increased while the pitch between the through-holes is kept unchanged, the line width of the several lines of the conductor pattern passing through and between the through-holes must be reduced, or the interlinear distance must be made smaller. This is a disadvantage. Consequently, this should be avoided as much as possible so as to prevent a decrease in the impedance of the conductor pattern or crosstalk between [portions] of the conductor pattern.

Also, the diameter of the solder balls cannot be too small or the connection reliability with respect to the mounting substrate cannot be maintained. In other words, the diameter of the solder balls must be larger than a prescribed value in consideration of the warping of the package and the mounting substrate during package assembly, and the package height after assembly.

The purpose of the present invention is to provide a type of IC package which has solder bumps bonded to the conductor pattern on the opposite side of the insulating substrate without filling the solder paste in the through-holes. The present invention also provides a manufacturing method for the aforementioned IC package.

Another purpose of the present invention is to provide a type of bump structure and its formation method in which the processing step of filling the solder paste is omitted without changing the thickness of the insulating substrate, diameter of the through-holes, diameter of the solder balls, and other basic dimensions, so as to improve the IC package fabrication efficiency.

On the other hand, when the IC package is mounted on an external substrate, thermal stresses occur at the solder bonding portion due to the differences in the thermal expansion coefficients of the mounting substrate and the package. Thermal stresses cause cracks to form in the solder bonding portion and lead to poor assembly of the package. Consequently, to improve the assembly reliability of the package, it is extremely important to minimize the thermal stresses at the solder bonding portion. Particularly for the BGA type semiconductor IC package, not only must the thermal stresses at the bonding portion between the solder balls and the mounting substrate be taken into consideration, but also the thermal stresses that take place at the bonding portion between the solder balls and the package-side conductor pattern.

Another purpose of the present invention is to improve the assembly reliability of the BGA type semiconductor IC package by reducing the thermal stresses that take place at the bonding portion between the solder balls and the package-side conductor pattern.

SUMMARY OF THE INVENTION

The present invention is preferably applicable to the BGA type semiconductor IC package in which two-dimensional solder bumps are formed on the lower surface of the insulating substrate supporting the IC chip. Through-holes are formed on the insulating substrate to match the positions where the solder bumps are formed. On the surface of the insulating substrate on the side supporting the IC chip, a conductor pattern is formed, with portions of the conductor pattern positioned above the through-holes. Also, the conductor pattern is electrically connected to the electrode pad of the IC chip on the other portion by, e.g., wire bonding. For the form of connection between the conductor pattern and the electrode pad of the IC chip, in addition to the connection method by means of the aforementioned wire bonding, the method of flipping the IC chip and directly bonding the electrode pad to the conductor pattern, that is, the method using the so-called flip chip, and various other connection forms, may be adopted.

The regions of the conductor pattern above the through-holes have portions protruding into the through-holes. This portion is preferred as it can simplify the manufacturing operation of the semiconductor device by processing the regions of the aforementioned conductor pattern above the through-holes to bump to the side of the through-holes. The present invention can also be realized by bonding the regions of the conductor pattern above the through-holes to the conductor bumps from the side of the through-holes.

However, the bumps of the conductor pattern formed by buckling processing are preferred to reduce the thermal stress occurring at these portions. It is believed that the offset of the conductor pattern by means of buckling processing creates a displacement with respect to the through-holes of the bump portions, reduces the stretching of the bump portions, and thus reduces the thermal stress at these portions. As a result, the difference in stretching on the solder ball side can be reduced and cracks are less likely to form.

Solder balls in approximately spherical form are carried on the through-holes from the lower surface of the insulating substrate, that is, the surface opposite the surface carrying the IC chip. Here, the portion of the aforementioned conductor pattern protruding into the through-holes makes physical contact with a portion of the through-hole. When the solder ball melts in this location, the melted solder is guided to the protruding portion of the conductor pattern in contact with it, and into the through-hole. As a result, the conductor pattern and the solder ball are bonded in the through-hole, forming a bump on the surface of the insulating substrate.

According to the present invention, in order to ensure that the melted solder ball and the conductor pattern are in contact with each other via the through-hole and free of any gaps, it is important to have a portion of the conductor pattern protrude into the through-hole. Since the solder ball is approximately spherical in form, a portion of it protrudes into the through-hole since it is carried on the through-hole. Consequently, there is no need for the conductor pattern to protrude completely to reach the opposite side. Instead, the amount of protrusion into the through-hole can be obtained by subtracting the amount of protrusion of the solder ball. The insulating substrates of the IC chip package that can be used in the present invention include rigid substrates made of paper phenol, glass cloth epoxy resin, and other feed materials, as well as flexible substrates made of polyimide films, etc.

The present invention may be applied to any semiconductor device having a constitution in which solder balls are in contact with the conductor pattern through through-holes formed on the insulating substrate. Also, the present invention can be applied to the CSP (Chip Size Package) with through-holes positioned below the IC chip and with the external dimensions of the package similar to those of the assembled IC chip.

BRIEF DESCRIPTION OF THE DRAWINGS

Drawing 1 is an oblique view in a partial cutaway of a 100-pin CSP of the present invention.

Drawing 2 is a side cross-sectional view of Drawing 1.

Figure 1:
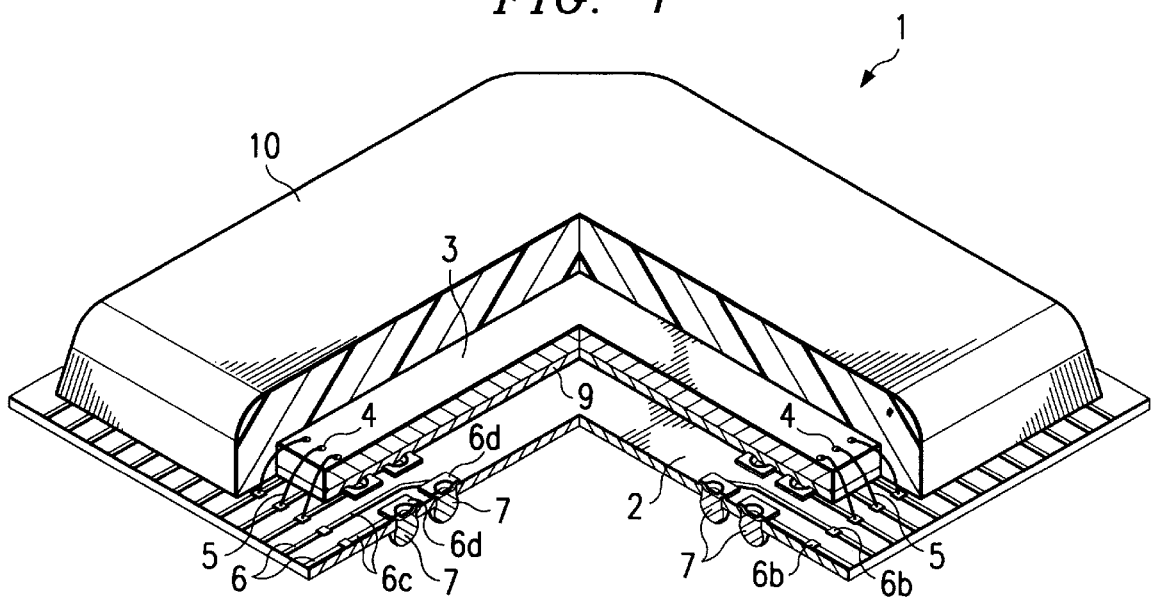
Figure 2:
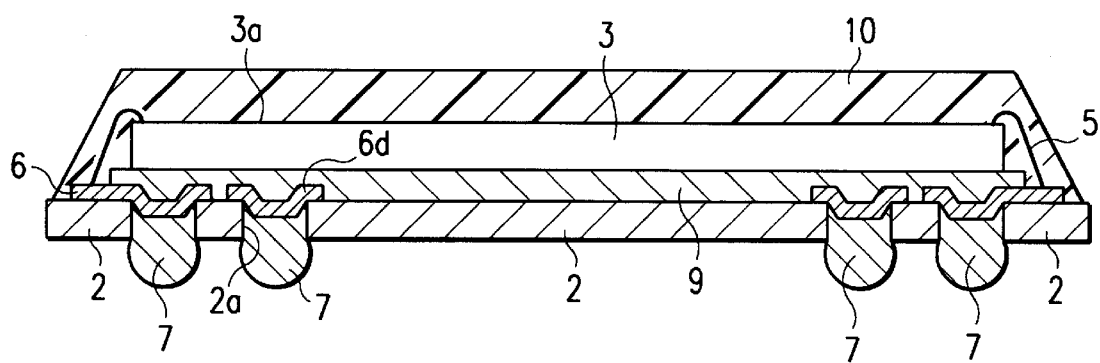
Figure 3:
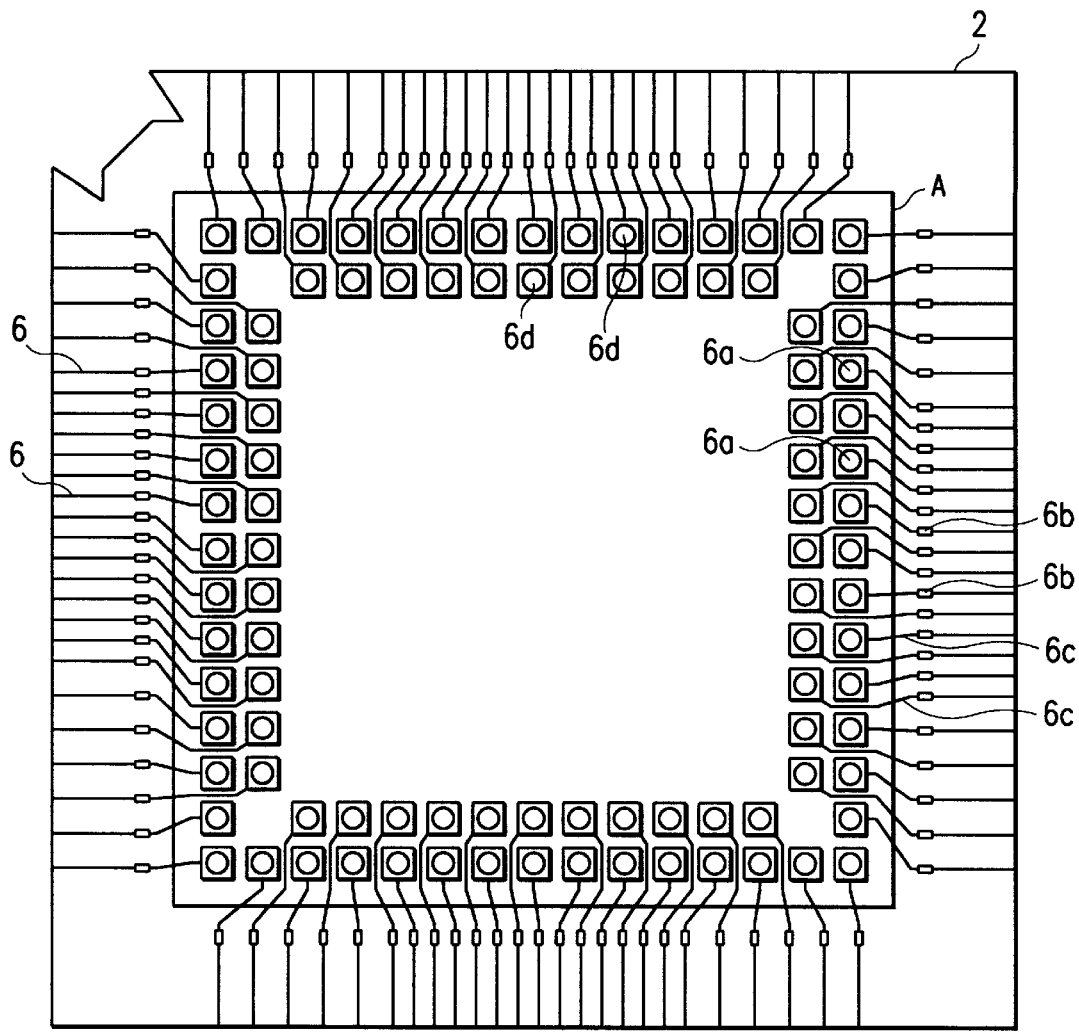
Figure 4:
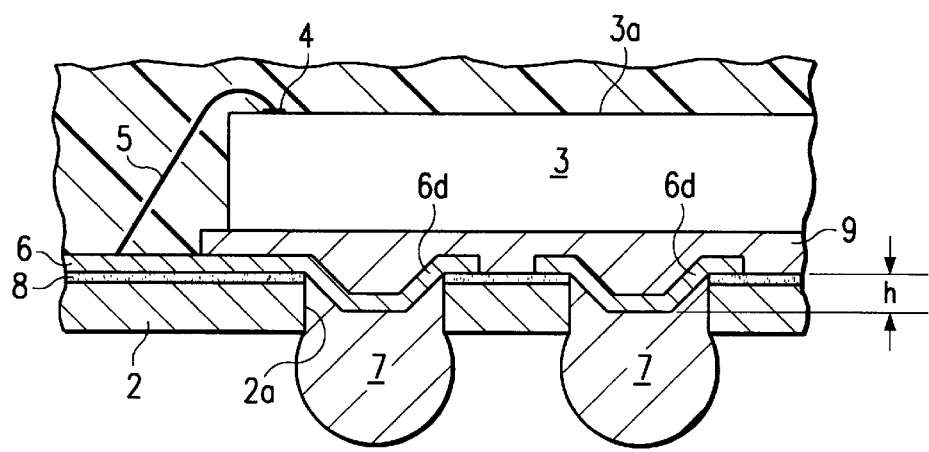
Figure 5A:
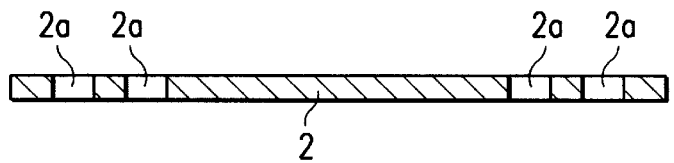
Figure 5B:
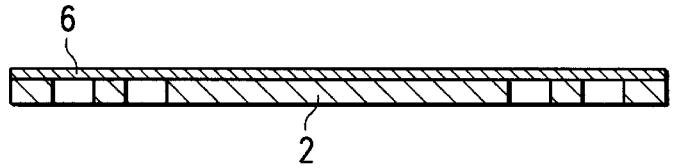
Figure 5C:
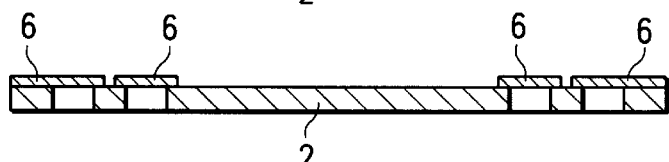
Figure 5D:
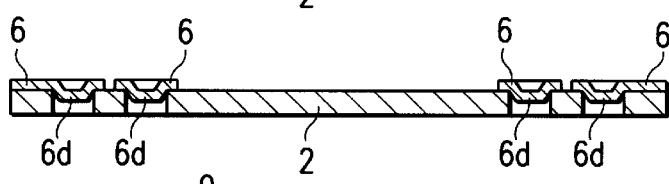
Figure 5E:
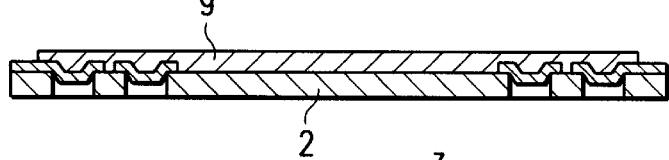
Figure 5F:
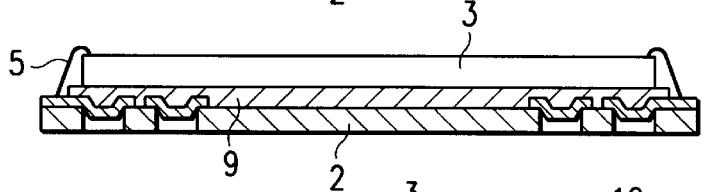
Figure 5G:
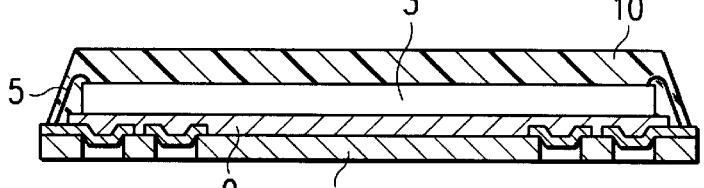
Figure 5H:
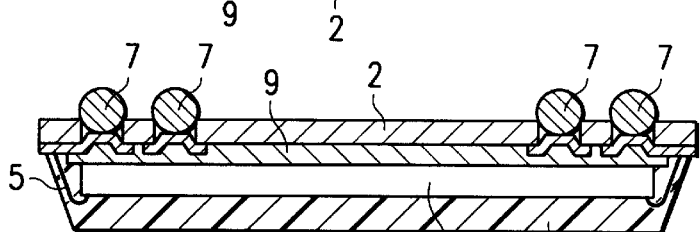
Figure 5I:
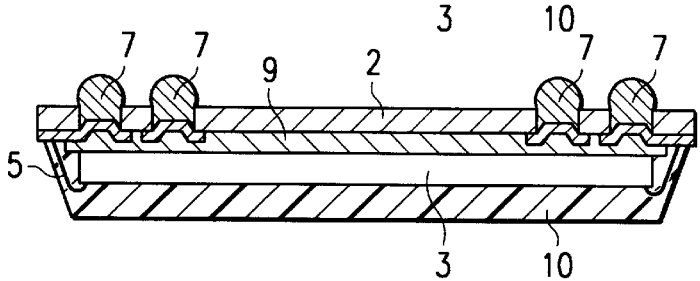

Drawing 3 is a plan view of the flexible insulating substrate using the package in Drawing 1.

Drawing 4 is an enlarged view illustrating the bonding portion between the connecting pad of the conductor pattern and the solder balls in Drawing 2.

Drawings 5A–5I are a diagram illustrating the manufacturing operation of the package shown in Drawing 1.

DESCRIPTION OF EMBODIMENTS

In the following, an embodiment of the present invention will be explained in more detail with reference to the drawings. Drawings 1–5 illustrate a semiconductor device to which the present invention is applied. This semiconductor device is a CSP having solder bumps for 100 corresponding pins. In semiconductor device (1) shown in Drawing 1, semiconductor IC chip (3) is carried on the upper surface of flexible insulating substrate (2), with principal surface (3a) formed by circuit elements and electrode pad (4) to be explained later facing upward.

Said flexible insulating substrate (2) has through-holes (2a) at the positions of assembly of solder balls (7). Through-holes (2a) are positioned in a region of flexible insulating substrate (2) where IC chip (3) is carried. They are arranged in two columns along the inner side of the periphery of this region. In an embodiment, flexible insulating substrate (2) is made of 75-$\mu$m-thick polyimide monolayer film, with 200-$\mu$m-diameter circular holes formed as through-holes (2a) thereon. The pitch between adjacent through-holes (2a) is 50 $\mu$m.

Conductor pattern (6) is formed on the surface of flexible insulating substrate (2) supporting IC chip (3). Said conductor pattern (6) comprises multiple electrically independent circuit lines that correspond to electrode pad (4) of IC chip (3). One end of each circuit line of conductor pattern (6) extends above through-hole (2a), and the other end extends to the outer side from the region of the substrate where IC chip (3) is supported. Drawing 3 clearly illustrates the configuration and form of conductor pattern (6) on flexible insulating substrate (2). As shown in Drawing 3, the inside end portion of each conductor pattern (6) contains a square connecting pad (6a) arranged to cover one through-hole (2a). The outside end portion of conductor pattern (6) extends to the end portion of flexible insulating substrate (2). Land (6b) is wider than the circuit line (6c) and is formed at the midpoint thereof; the aforementioned circuit line extends to the outside of conductor pattern (6). Each land (6b) is positioned on the outer side of region A carrying IC chip (3) of flexible insulating substrate (2). Each portion of electrode pad (4) of IC chip (3) is connected to the corresponding land (6b) of the conductor pattern by means of wire bonding via conductor wire (5).

As can be seen from the aforementioned explanation, the portion of the circuit line toward the side outer side of land (6b) of each portion of conductor pattern (6) is not necessary to perform the intrinsic function of the conductor pattern of electrically connecting the IC chip and the external substrate. It merely functions as a terminal for transferring current to each portion of the conductor pattern when conductor pattern (6) is electrically plated. Conductor pattern (6) is prepared by etching the copper foil bonded on flexible insulating substrate (2) via epoxy adhesive layer (8) to the prescribed pattern. The surface of conductor pattern (6) is plated by nickel/gold by means of electric plating. In an embodiment, the conductor pattern has a thickness of 25 $\mu$m, each edge of connecting pad (6a) is 350 $\mu$m long, land (6b) is 100 $\mu$m wide, and circuit line (6c) is 40 $\mu$m wide.

Drawing 4 is an enlarged view illustrating the bonding portion between connecting pad (6a) of said conductor pattern (6) and solder ball (7) in Drawing 2. It can be seen from Drawing 4 that said connecting pad (6a) positioned above through-hole (2a) has a mesa-shaped bump (6d) protruding into through-hole (2a). In this embodiment, bump (6d) is formed by punching the center of connecting pad (6a) flatly extending onto through-hole (2a) by means of a punching die from the upper side. Solder ball (7) is bonded to bump (6d) protruding into through-hole (2a). Drawing 4 illustrates the state after bonding of solder ball (7). The amount of protrusion of bump (6b) is selected appropriately to ensure that before bonding of the spherical solder ball, the edge surface of bump (6d) (facing downward in Drawing 4) comes in direct contact with part of solder ball (7). During manufacturing, the package is inverted so that flexible insulating substrate (2) is up, and solder balls (7) formed in another step of operation are moved onto through-holes (2a). In this way, by means of overall reflow, solder balls (7) are melted and are bonded to bumps (6d). Since solder balls (7) are heated, the solder balls fill up through-holes (2a) from the contact point with bumps (6d) as the starting point.

In the present invention, it is necessary to consider amount of protrusion h of bumps (6d) to ensure sufficient direct contact of the edge surfaces of bumps (6d) with solder balls (7). For this purpose, one should consider the amount of protrusion of the solder balls into the through-holes when the solder balls are carried in such a state that solder balls (7) are in contact with the edges of through-holes (2a). In this embodiment, the diameter of solder balls (7) is 300 μm, and the diameter of through-holes (2a) is 200 μm, so that the amount of protrusion of the solder balls into the through-holes is about 38 μm. The sum of the thickness of flexible insulating substrate (75 μm) and the thickness of adhesive layer (8) (12 μm) is 87 μm. With these dimensions the amount of protrusion h of bumps (6b) must be 49 μm or more in order that the surfaces of the tips of bumps (6d) make direct contact with solder balls (7). In this embodiment, amount of protrusion h was set at 60 μm. On the other hand, if amount of protrusion of bumps (6b) is too large, when solder balls (7) are transferred, the solder balls may become unstable inside the through-holes or deviation of position may take place. In order to ensure the stability of the solder balls before melting, it is necessary that the tops of bumps (6d) at least do not project from the surface on the opposite side of flexible insulating substrate (2), or preferably they have a certain recess.

The semiconductor device with a constitution of this embodiment and a conventional semiconductor device were compared with respect to thermal stress. In the conventional semiconductor device, there are no bumps in the semiconductor pattern at the position of the through-hole. Instead, bonding of the solder ball is carried out by filling he through-hole with solder paste. For the semiconductor device of the present invention and the conventional semiconductor device, a thermal cycle test was carried out at −25° C. through 125° C. when they were assembled on the external substrates. It was found that the thermal stress at the interface between the solder ball and the conductor pattern was 20–30% lower with the semiconductor device of the present invention than with the conventional semiconductor device.

In the following, the manufacturing operation of said semiconductor device (1) will be explained with reference to Drawings 5(A)–(I). As shown in Drawing 5(A), a layer of adhesive is formed on the surface of flexible insulating substrate (2); then, through-holes (2a) are formed by punching. Copper foil (6) is bonded on said layer of adhesive (step (B)), followed by patterning and etching to form conductor pattern (6). Then, nickel/gold plating of this surface is carried out (step (C)). In step D, the regions of conductor pattern (6) on through-holes (2a) are subject to buckling processing to form bumps (6d) that protrude into through-holes (2a). By means of punching in columns in a configuration corresponding to the positions of all of through-holes (2a), it is possible to form all of the bumps on a single flexible insulating substrate.

Then, layer (9) of solder resist is formed on the region of flexible insulating substrate (2) that carries the IC chip (step (E)). IC chip (3) is carried on the layer of solder resist with the electrode pad wire-bonded to the land of conductor pattern (6) (step (F)). Resin (10) is molded so as to cover IC chip (3), forming the package of the semiconductor device (step (G)). Then, the package is inverted so that flexible insulating substrate (2) is up and solder balls (7) formed in another processing step are moved and carried on through-holes (2a) (step (H)). It is possible to adopt a method in which multiple solder balls (7) are drawn by vacuum on a suction fixture, and, after transfer of flux, the solder balls are moved and carried on the through-holes. In this state, overall reflow is carried out to melt solder balls (7) to bond with bumps (6d) (step (I)). In the aforementioned processing steps of semiconductor device (1), solder balls (7) are manufactured. In the aforementioned manufacturing operation, flexible insulating substrate (2) was taken as a single independent substrate. However, it is also possible to provide the aforementioned flexible insulating substrate by using a tape-like substrate (known as TAB tape) like that used in TAB (Tape Automated Bonding).

As explained above, during the manufacture of the semiconductor device of the present invention, when the solder balls are assembled, there is no need to fill the through-holes with solder paste beforehand. Since it is possible to omit the processing step of filling the solder paste during the manufacture of the semiconductor device it is possible to increase the efficiency of the semiconductor device fabrication process and to reduce the cost.

In order to realize the present invention, there is no need to change the conventional basic design. That is, the thickness of the flexible insulating substrate, configuration of the through-holes and their diameter, size of the solder balls, configuration of carrying of the chip, and other conventional specifications can be adopted directly, and the conventional design, equipment, etc., of the semiconductor devices can be used unchanged.

As the bumps of the conductor pattern are formed by means of buckling processing, it is possible to reduce the thermal stress at the interface between the aforementioned bumps and the solder balls. Since the thermal stress can be reduced, it is less like that cracks will form at the interface, and the assembly reliability of the package can be increased.
Explanation of the Reference Numbers In the drawings, 1 represents a semiconductor device, 2 a flexible insulating substrate, 3 an IC chip, 3a a principal surface, 4 an electrode pad, 5 a conductor wire, 6 a conductor pattern, 6a a connecting pad, 6b a land, 6c a circuit line, 6d a bump, 7 a solder ball, 8 an adhesive layer, 9 a solder resist layer, 10 a mold resin.

What is claimed is:

1. A semiconductor device comprising the following parts:

IC chip, an insulating substrate which carries the IC chip and has non-conducting through-holes thereon;

a conductor pattern that is formed on the surface of the insulating substrate on a side carrying the IC chip and that is electrically connected to an electrode pad formed on the IC chip and having protrusions formed from the conductor pattern that project into the through-holes;

and solder balls bonded to the portions of the conductor pattern which protrude into the through-holes.

2. The semiconductor device of claim 1, wherein the regions of the conductor pattern above the through-holes are subject to buckling processing and protrude inside the through-holes.

3. The semiconductor device of claim 1, wherein the insulating substrate is a flexible insulating substrate.

4. The semiconductor device of claim 1, wherein the through-holes are positioned below the IC chip.

5. The semiconductor device of claim 4, wherein the conductor pattern has land portions, which are connected to the portions protruding into the through-holes, on the outer side of the region of the insulating substrate that carries the IC chip; and that the electrode pad of the IC chip and the land portions are wire-bonded.

6. The semiconductor device of claim 2, wherein the insulating substrate is a flexible insulating substrate.

7. The semiconductor device of claim 2, wherein the through-holes are positioned below the IC chip.

8. The semiconductor device of claim 2, wherein the through-holes are positioned below the IC chip.

* * * * *